US010865886B2

(12) United States Patent
Lee et al.

(10) Patent No.: US 10,865,886 B2
(45) Date of Patent: Dec. 15, 2020

(54) PRESSURE CONTROL VALVE AND APPARATUS AND METHOD FOR PROCESSING A SUBSTRATE INCLUDING THE SAME

(71) Applicant: Samsung Electronics Co., Ltd., Suwon-si (KR)

(72) Inventors: Jin-Won Lee, Siheung-si (KR); Young-Joo Kim, Yongin-si (KR); Kwang-Uk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 16/044,639

(22) Filed: Jul. 25, 2018

(65) Prior Publication Data

US 2019/0145528 A1 May 16, 2019

(30) Foreign Application Priority Data

Nov. 16, 2017 (KR) ........................ 10-2017-0153420

(51) Int. Cl.
*F16K 3/34* (2006.01)
*F16K 1/22* (2006.01)
(Continued)

(52) U.S. Cl.
CPC ............ *F16K 3/34* (2013.01); *C23C 16/4584* (2013.01); *F16K 1/223* (2013.01); *F16K 3/32* (2013.01);
(Continued)

(58) Field of Classification Search
CPC ... F16K 3/34; F16K 3/32; F16K 1/223; F16K 31/041; F16K 37/0041; F16K 51/02; C23C 16/4584
(Continued)

(56) References Cited

U.S. PATENT DOCUMENTS 3,656,504 A * 4/1972 Topinka .............. F16K 37/0008
137/363
4,055,324 A * 10/1977 Hughes ..................... F16K 5/04
251/309
(Continued)

FOREIGN PATENT DOCUMENTS

| JP | 1996093932 | 4/1996 | |
|---|---|---|---|
| JP | 2002317656 | 10/2002 | |
| JP | 2007024070 A | 2/2007 | |
| KR | 10-0637356 | 10/2006 | |
| WO | WO-2011130341 A1 * | 10/2011 | .......... F16K 11/0856 |

*Primary Examiner* — Kevin R Barss
(74) *Attorney, Agent, or Firm* — Muir Patent Law, PLLC

(57) ABSTRACT

A pressure control valve may include a valve body, a fixed cylinder and a rotating cylinder. The valve body may have an inlet port and an outlet port. The fixed cylinder may be fixed to an inner wall of the valve body. The fixed cylinder may include a quadrangular first fixed hole connected to the inlet port, and a quadrangular second fixed hole connected to the outlet port. The rotating cylinder may be rotatably arranged in the fixed cylinder. The rotating cylinder may include a quadrangular first pressure control hole selectively connected to the first fixed hole, and a quadrangular second pressure control hole selectively connected to the second fixed hole. Thus, the pressure control valve including the quadrangular fixed hole and the quadrangular pressure control hole may have improved pressure control function.

31 Claims, 8 Drawing Sheets

(51) Int. Cl.
*F16K 3/32* (2006.01)
*F16K 51/02* (2006.01)
*C23C 16/458* (2006.01)
*F16K 37/00* (2006.01)
*F16K 5/04* (2006.01)
*F16K 31/04* (2006.01)

(52) U.S. Cl.
CPC .............. *F16K 5/04* (2013.01); *F16K 31/041* (2013.01); *F16K 37/0041* (2013.01); *F16K 51/02* (2013.01)

(58) Field of Classification Search
USPC ........................................................ 251/208
See application file for complete search history.

(56) References Cited

U.S. PATENT DOCUMENTS

| | | | | |
|---|---|---|---|---|
| 4,702,279 A | * | 10/1987 | Giese | ..................... F16K 3/267 |
| | | | | 137/625.17 |
| 6,182,697 B1 | * | 2/2001 | Parker | ..................... F15B 13/01 |
| | | | | 137/625.16 |
| 6,880,802 B2 | * | 4/2005 | Hara | ......................... F16K 3/08 |
| | | | | 137/315.17 |
| 7,089,663 B2 | | 8/2006 | Arai et al. | |
| 7,455,076 B2 | | 11/2008 | Kwon et al. | |
| 8,839,817 B2 | * | 9/2014 | Dederich | ................ F16K 31/54 |
| | | | | 137/614.11 |
| 9,625,047 B2 | | 4/2017 | Hirose et al. | |

* cited by examiner

PRESSURE CONTROL VALVE AND APPARATUS AND METHOD FOR PROCESSING A SUBSTRATE INCLUDING THE SAME

CROSS-RELATED APPLICATION

This application claims priority under 35 USC § 119 to Korean Patent Application No. 2017-0153420, filed on Nov. 16, 2017 in the Korean Intellectual Property Office (KIPO), the contents of which are herein incorporated by reference in their entirety.

BACKGROUND

1. Field

Example embodiments relate to a pressure control valve and an apparatus and method for processing a substrate including the same. More particularly, example embodiments relate to a pressure control valve configured to control an internal pressure of a chamber for processing a semiconductor substrate, and an apparatus and method for processing a substrate including the pressure control valve.

2. Description of the Related Art

Generally, an internal pressure of a chamber for processing a semiconductor substrate may be controlled by a pressure control valve. The pressure control valve may include a valve body connected to the chamber, a fixed cylinder fixed to an inner wall of the valve body, and a rotating cylinder rotatably arranged in the fixed cylinder. The fixed cylinder may have two fixed holes. The rotating cylinder may have two pressure control holes. An opening ratio between the fixed holes and pressure control holes may be changed by rotating the rotating cylinder. The internal pressure of the chamber may be controlled by changing the opening ratio. Thus, the pressure control function of the pressure control valve may be determined by areas of the fixed holes and the pressure control holes.

According to related arts, the fixed holes and the pressure control holes may have a circular shape. There may be restrictions in forming the circular fixed holes and the circular pressure control holes at the fixed cylinder and the rotating cylinder. For example, the areas of the circular fixed holes and the circular rotating holes may be restricted. Therefore, the pressure control valve may have low pressure control functionality.

Further, the opening ratio between the fixed hole and the pressure control hole may be determined by partially overlapping the circular fixed hole with the circular pressure control hole. Thus, the opening ratio between the fixed hole and the pressure control hole may be sharply changed by uniformly rotating the rotating cylinder. The sharp change of the opening ratio may cause an inaccurate control of the pressure in the chamber.

SUMMARY

Example embodiments provide a pressure control valve having improved pressure control function.

Example embodiments also provide an apparatus and method for processing a substrate including the above-mentioned pressure control valve.

According to example embodiments, there may be provided a pressure control valve. The pressure control valve may include a valve body, a fixed cylinder and a rotating cylinder. The valve body may have an inlet port and an outlet port. The fixed cylinder may be fixed to an inner wall of the valve body. The fixed cylinder may include a quadrangular first fixed hole connected to the inlet port, and a quadrangular second fixed hole connected to the outlet port. The rotating cylinder may be rotatably arranged in the fixed cylinder. The rotating cylinder may include a quadrangular first pressure control hole selectively connected to the first fixed hole, and a quadrangular second pressure control hole selectively connected to the second fixed hole.

According to example embodiments, there may be provided a pressure control valve. The pressure control valve may include a valve body, a fixed cylinder, a rotating cylinder, a rotating unit. The valve body may have an inlet port and an outlet port arranged on a straight line. The fixed cylinder may be fixed to an inner wall of the valve body. The fixed cylinder may include a rectangular first fixed hole connected to the inlet port, and a rectangular second fixed hole connected to the outlet port. The fixed cylinder may have an axial direction perpendicular to the straight line. The rotating cylinder may be rotatably arranged in the fixed cylinder. The rotating cylinder may include a rectangular first pressure control hole selectively connected to the first fixed hole, and a rectangular second pressure control hole selectively connected to the second fixed hole. The first pressure control hole may have a size substantially the same as that of the first fixed hole. The second pressure control hole may have a size substantially the same as that of the second fixed hole. The rotating cylinder may have an axial direction parallel to the axial direction of the fixed cylinder. The rotating unit may be configured to rotate the rotating cylinder.

According to example embodiments, there may be provided an apparatus for processing a substrate. The apparatus may include a chamber, a pressure control valve and a vacuum pump. The pressure control valve may include a valve body, a fixed cylinder and a rotating cylinder. The valve body may have an inlet port connected to the chamber and an outlet port. The fixed cylinder may be fixed to an inner wall of the valve body. The fixed cylinder may include a quadrangular first fixed hole connected to the inlet port, and a quadrangular second fixed hole connected to the outlet port. The rotating cylinder may be rotatably arranged in the fixed cylinder. The rotating cylinder may include a quadrangular first pressure control hole selectively connected to the first fixed hole, and a quadrangular second pressure control hole selectively connected to the second fixed hole. The vacuum pump may be connected to the outlet port to provide the valve body with vacuum.

According to example embodiments, the fixed hole and the pressure control hole may have the quadrangular shape so that the fixed hole and the pressure control hole may have a relatively large size. Thus, the pressure control valve including the quadrangular fixed hole and the quadrangular pressure control hole may have improved pressure control function. Further, an opening ratio between the quadrangular fixed hole and the quadrangular pressure control hole may be uniformly changed by rotating the rotating cylinder. Therefore, the opening ratio between the quadrangular fixed hole and the quadrangular pressure control hole may be accurately controlled so that the internal pressure of the chamber may also be accurately controlled.

BRIEF DESCRIPTION OF THE DRAWINGS

Example embodiments will be more clearly understood from the following detailed description taken in conjunction with the accompanying drawings.

FIG. 1 is a cross-sectional view illustrating a pressure control valve in accordance with example embodiments;

FIG. 2 is a perspective view illustrating a fixed cylinder of the pressure control valve in FIG. 1 in accordance with example embodiments;

FIG. 3 is a perspective view illustrating a rotating cylinder of the pressure control valve in FIG. 1 in accordance with example embodiments;

FIG. 4 is an exploded perspective view illustrating the fixed cylinder in FIG. 2 and the rotating cylinder in FIG. 3 in accordance with example embodiments;

FIG. 5 is a perspective view illustrating the fixed cylinder and the rotating cylinder in FIG. 4 in accordance with example embodiments;

FIG. 6 is a perspective view illustrating the rotating cylinder in FIG. 5 primarily rotated from a fully opened position;

FIG. 7 is a perspective view illustrating the rotating cylinder in FIG. 6 secondarily rotated;

FIG. 8 is an exploded perspective view illustrating a fixed cylinder in accordance with example embodiments;

FIG. 9 is a perspective view illustrating a rotating cylinder in accordance with example embodiments;

FIG. 10 is a cross-sectional view illustrating an apparatus for processing a substrate including the pressure control valve in FIG. 1 in accordance with example embodiments; and FIG. 11 is a flow chart illustrating a method for processing a substrate and manufacturing a semiconductor device in accordance with example embodiments.

DETAILED DESCRIPTION

Hereinafter, example embodiments will be explained in detail with reference to the accompanying drawings.

Pressure Control Valve

Figure 1:
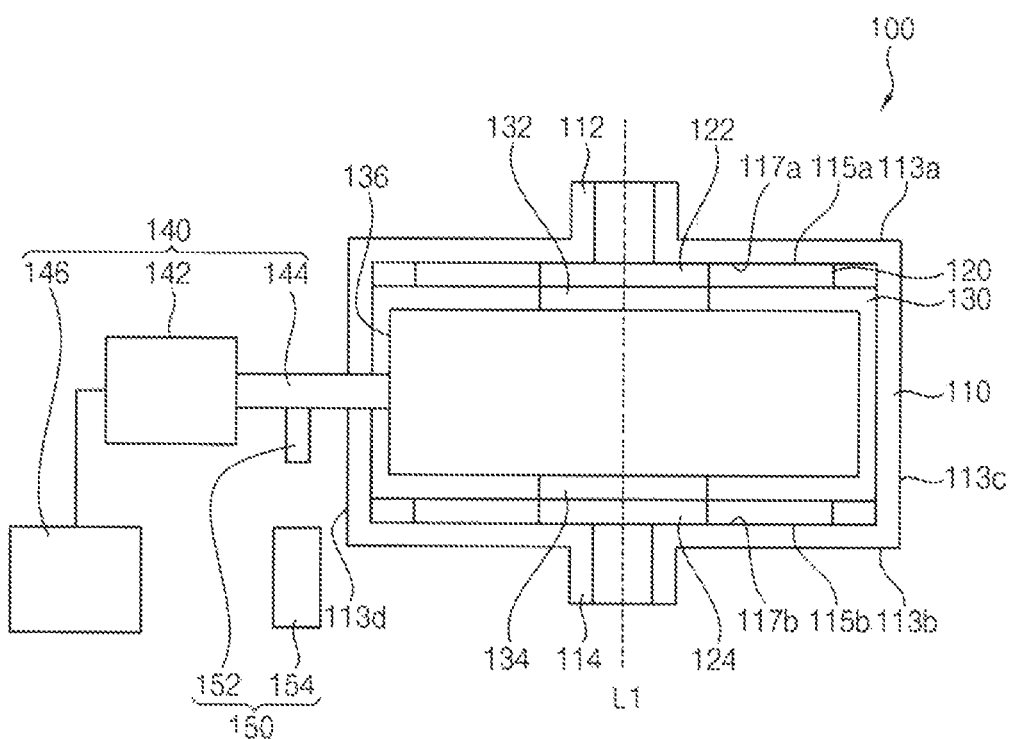
FIGS. 1 to 11 represent non-limiting, example embodiments as described herein.
Figure 1:
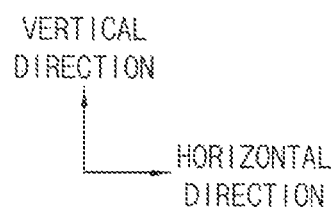
Figure 2:
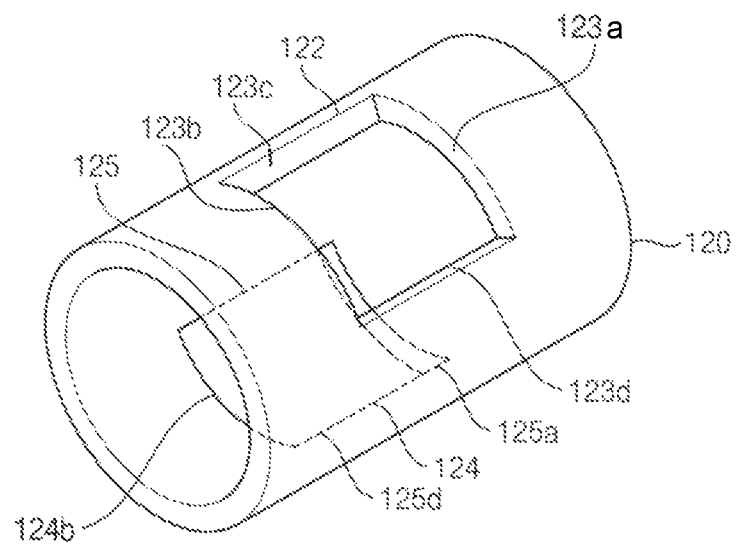
Figure 3:
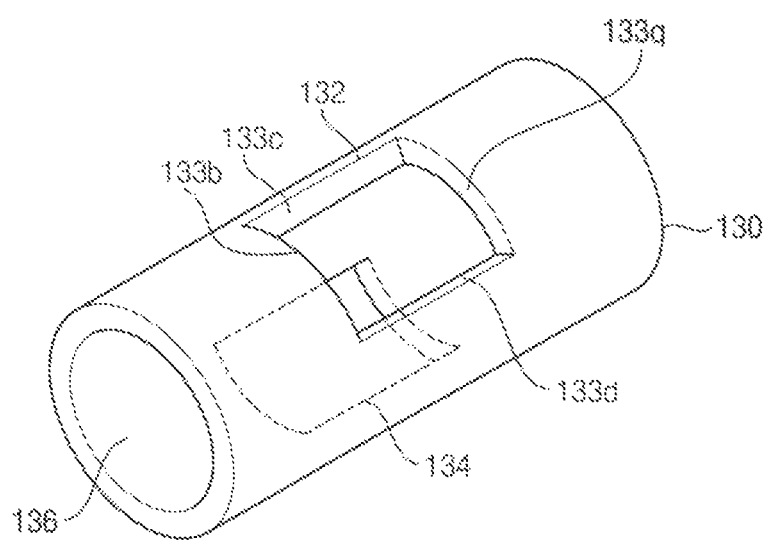
Figure 4:
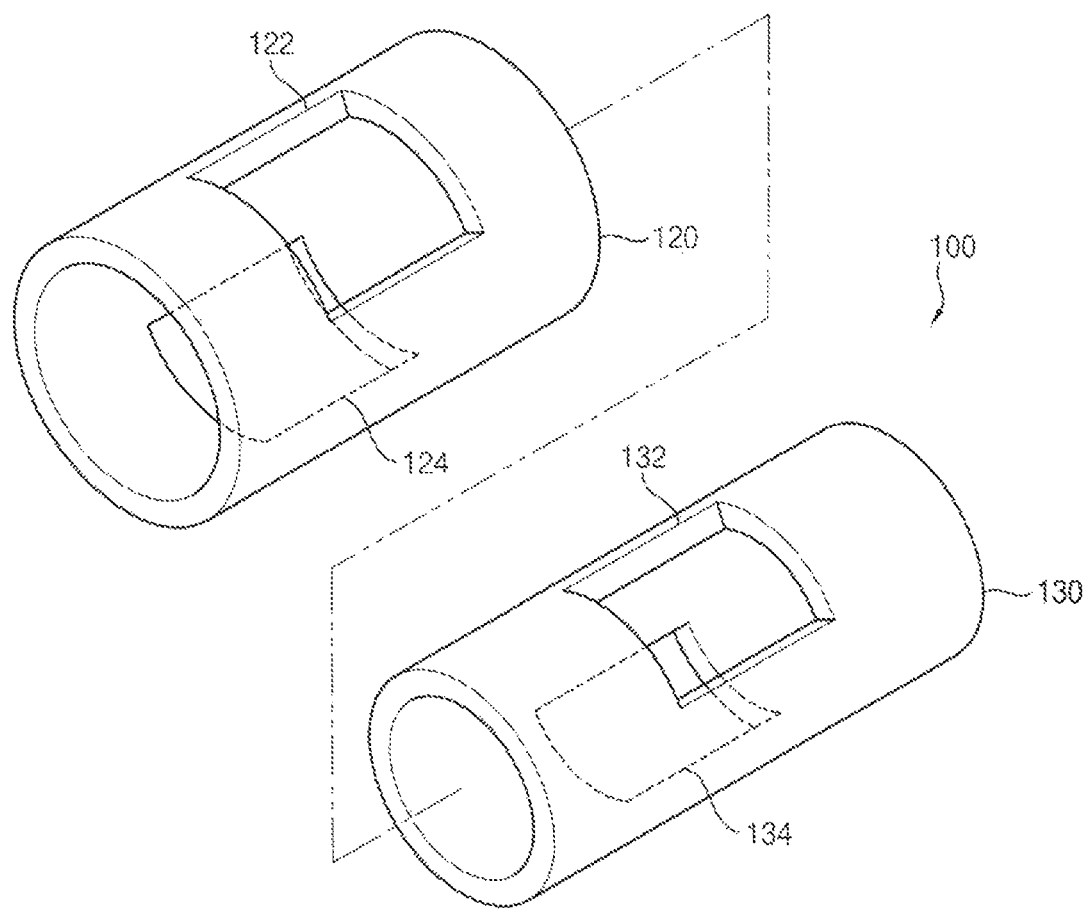
Figure 5:
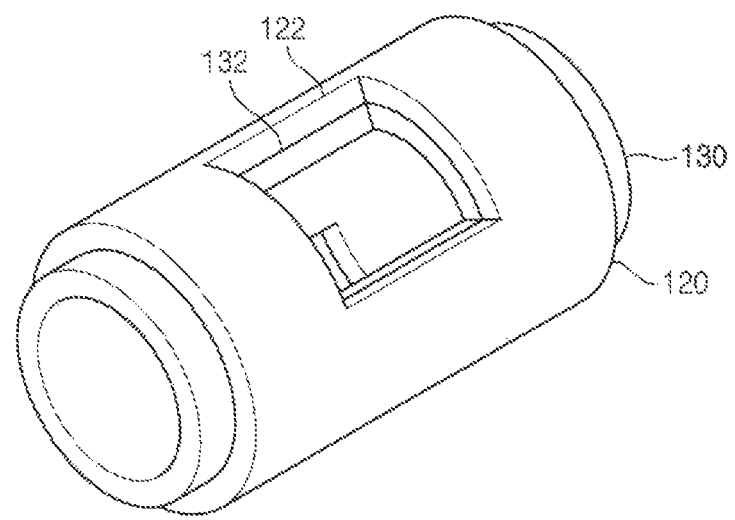

FIG. 1 is a cross-sectional view illustrating a pressure control valve in accordance with example embodiments, FIG. 2 is a perspective view illustrating a fixed cylinder of the pressure control valve in FIG. 1 in accordance with example embodiments, FIG. 3 is a perspective view illustrating a rotating cylinder of the pressure control valve in FIG. 1 in accordance with example embodiments, FIG. 4 is an exploded perspective view illustrating the fixed cylinder in FIG. 2 and the rotating cylinder in FIG. 3 in accordance with example embodiments, and FIG. 5 is a perspective view illustrating the fixed cylinder and the rotating cylinder in FIG. 4 in accordance with example embodiments.

Referring to FIGS. 1 to 5, a pressure control valve 100 of this example embodiment may include a valve body 110, a fixed cylinder 120, a rotating cylinder 130, a rotating unit 140 and a detecting unit 150.

The valve body 110 may have a hollow cylindrical shape. Alternatively, the valve body 110 may have a hollow rectangular parallelepiped shape. The valve body 110 may include an inlet port 112 and an outlet port 114.

The inlet port 112 may be formed at an upper surface 113a (e.g., flat surface) of the valve body 110. The inlet port 112 may be connected to an object having an inner pressure controlled by the pressure control valve 100, for example, a chamber of a substrate processing apparatus. Thus, a gas in the chamber may be introduced into the valve body 110 through the inlet port 112.

The outlet port 114 may be formed at a lower surface 113b (e.g., flat surface) of the valve body 110. The outlet port 114 may be connected to a vacuum pump. Thus, vacuum generated from the vacuum pump may be applied into the valve body 110 through the outlet port 114. The gas introduced into the valve body 110 through the inlet port 112 may be exhausted through the outlet port 114. The terms "upper" and "lower" are used here and in other portions of this specification in a relative manner with respect to each other. In some embodiments, the inlet port 112 may be positioned at a higher location with respect to the ground than the outlet port 114, but such orientation is only one example and the disclosure is not limited as such.

In example embodiments, the inlet port 112 and the outlet port 114 may be positioned on one straight line. For example, the inlet port 112 and the outlet port 114 may have substantially the same concentric axis. Terms such as "same," "equal," "planar," or "coplanar," "parallel," or "perpendicular," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. Because the inlet port 112 may be arranged on the upper surface of the valve body 110 and the outlet port 114 may be arranged on the lower surface of the valve body 110, the straight line may correspond to a vertical line. The vertical line may correspond to an axial direction of the valve body 110. For example, the valve body 110 may be a cylinder or parallelepiped arranged axially symmetrically around a line L1 passing through concentric axes of the inlet port 112 and outlet port 114. In this case, the upper surface 113a and lower surface 113b of the valve body 110 may be flat, and the side surfaces 113c and 113d of the valve body 110 may be curved or angled to form a circular or elliptical shape or a polygon shape formed concentrically with respect to the line L1.

In some embodiments, the inlet port 112 and the outlet port 114 may have different axes parallel to each other or that intersect each other. In these cases, the axis of the outlet port 114 may be offset from the axis of the inlet port 112 or may cross the axis of the inlet port 112. In these cases, other than the location of the inlet port 112 and outlet port 114, the remainder of the valve body 110 may still be symmetric around a central axis line L1.

In some embodiments, the valve body includes crossing sections. One section is a first cylinder or parallelepiped extending in the vertical direction (as shown in FIG. 1), and another section is a second cylinder or parallelepiped that crosses the first cylinder or parallelepiped and houses the fixed cylinder 120 and rotating cylinder 130.

The fixed cylinder 120 may be arranged in the valve body 110. The fixed cylinder 120 may have a hollow cylindrical shape. The fixed cylinder 120 may have opened side surfaces, and may also have opened ends. The fixed cylinder 120 may have an axial direction perpendicular to the central axis line L1 of the valve body 110. Also, the fixed cylinder 120 may be perpendicular to at least a portion of the valve body 110 (e.g., a cylinder or parallelepiped having top surface 113a, bottom surface 113b, and side surfaces 113c and 113d). Thus, the axial direction of the fixed cylinder 120 may correspond to a horizontal direction.

The fixed cylinder 120 may be fixed to an inner wall of the valve body 110. For example, as can be seen in FIG. 1, a part of an outer sidewall 115a of the fixed cylinder 120 may be fixed to a first flat inner surface 117a of valve body 110 (e.g., an inner top surface), and a part of an opposite outer sidewall 115b of the fixed cylinder 120 may be fixed to a second, opposite, flat inner surface 117b of valve body 110 (e.g., an inner bottom surface). Therefore, the fixed cylinder 120 may have an outer surface fixed to upper and lower inner surfaces of the valve body 110. Alternatively, the fixed cylinder 120 may have both end surfaces fixed to an inner surface of the valve body 110 (e.g., where the valve body 110 has a cross shape, and part of an end surface of the fixed cylinder is fixed to part of the valve body 110 that crosses the cylinder having surfaces 113a-113d).

The fixed cylinder 120 may include a first fixed hole 122 and a second fixed hole 124. The first fixed hole 122 may be formed at an upper portion of the fixed cylinder 120, for example on a first side of the fixed cylinder 120. The first fixed hole 122 may be connected to the inlet port 112. The second fixed hole 124 may be formed at a lower portion of the fixed cylinder 120, for example on a second, opposite side of the fixed cylinder 120. The second fixed hole 124 may be connected to the outlet port 114. Thus, the first fixed hole 122 and the second fixed hole 124 may be positioned on one vertical line. The vertical line L1 passing through the first fixed hole 122 and the second fixed hole 124 may correspond to the concentric axis of the inlet port 112 and the outlet port 114. The first fixed hole 122 may align with the second fixed hole 124 when viewed from the vertical line L1.

The first fixed hole 122 may have a quadrangular shape. In example embodiments, the first fixed hole 122 may have a rectangular shape. Thus, the first fixed hole 122 may have relatively short edges 123a and 123b and substantially perpendicular to the axial direction of the fixed cylinder 120 (when viewed from the vertical line L1), and relatively long edges 123c and 123d parallel to the axial direction of the fixed cylinder 120.

The gas may be introduced into the fixed cylinder 120 through the first fixed hole 122. Thus, an area of the first fixed hole 122 may function as to determine a gas inflow rate (e.g., a maximum gas inflow rate). The gas inflow rate may be increased proportionally by increasing the area of the first fixed hole 122. The increase of the gas inflow rate may result in improving functions of the pressure control valve 100. Therefore, in order to improve the functions of the pressure control valve 100, it may be desirable to maximally enlarge the area of the first fixed hole 122.

As mentioned above, the rectangular first fixed hole 122 may have an area larger than that of a circular first fixed hole. Because the circular first fixed hole may be formed at only the upper portion of the fixed cylinder 120, the circular first fixed hole may have a diameter of no more than an upper circumferential length of the fixed cylinder 120. As a result, it may be restricted to enlarge the area of the circular first fixed hole.

In contrast, the rectangular first fixed hole 122 may have a short edge length substantially the same as the diameter of the circular first fixed hole. However, the rectangular first fixed hole 122 may have a long edge length longer than the diameter of the circular first fixed hole. For example, the long edge length of the rectangular first fixed hole 122 may be determined by an axial length of the fixed cylinder 120.

The second fixed hole 124 may have a quadrangular shape. In example embodiments, the second fixed hole 124 may have a rectangular shape substantially the same as that of the first fixed hole 122. Thus, the second fixed hole 124 may have relatively short edges 125a and 125b substantially perpendicular to the axial direction of the fixed cylinder 120 (when viewed from the vertical line L1), and relatively long edges 125c and 125d parallel to the axial direction of the fixed cylinder 120.

An area of the second fixed hole 124 may function to determine a gas outflow rate (e.g., a maximum gas outflow rate). The gas outflow rate may be increased proportionally by increasing the area of the second fixed hole 124. The increase of the gas outflow rate may result in improving functions of the pressure control valve 100. Therefore, in order to improve the functions of the pressure control valve 100, it may be desirable to maximumly enlarge the area of the second fixed hole 124. The rectangular second fixed hole 124 may have a short edge length substantially the same as the diameter of the circular first fixed hole. In contrast, the rectangular second fixed hole 124 may have a long edge length longer than the diameter of the circular first fixed hole. For example, the long edge length of the rectangular first fixed hole 122 may be no less than about 30% of the axial length of the fixed cylinder 120.

The rotating cylinder 130 may be rotatably arranged in the fixed cylinder 120. The rotating cylinder 130 may have a hollow cylindrical shape. The rotating cylinder 130 may have an outer surface configured to rotatably contact the inner surface of the fixed cylinder 120. "Contact" as used herein refers to a direct connection between two items, e.g., touching. Thus, the rotating cylinder 130 may have a diameter shorter than that of the fixed cylinder 120. The rotating cylinder 130 may have two opposite closed end surfaces. The rotating cylinder 130 may have an axial direction the same as that of the fixed cylinder 120. Therefore, the rotating cylinder 130 may be rotated in the fixed cylinder 120 with respect to the axial direction of the fixed cylinder 120. The rotating cylinder 130 may have an axial length longer than that of the fixed cylinder 120. In some embodiments, both the rotating cylinder 130 and the fixed cylinder 120 are formed of materials with low coefficients of friction with respect to each other. For example, in one embodiment, both the rotating cylinder 130 and the fixed cylinder 120 are formed of Teflon. However, other materials may be used, and the two cylinders need not be formed of the same material.

The rotating cylinder 130 may include a first pressure control hole 132 and a second pressure control hole 134. The first pressure control hole 132 may be formed at an upper portion of the rotating cylinder 130, for example on a first side of the rotating cylinder 130. The first pressure control hole 132 may be connected to the first fixed hole 122. For example, the first pressure control hole 132 may at least partly align with the first fixed hole 122, and is configured to overlap with the first fixed hole 122 by different controllable amounts. The second pressure control hole 134 may be formed at a lower portion of the rotating cylinder 130, for example on a second, opposite side of the rotating cylinder 130. The second pressure control hole 134 may be connected to the second fixed hole 124, for example, the second pressure control hole 134 may at least partly align with the second fixed hole 132, and is configured to overlap with the second fixed hole 132 by different controllable amounts. The first pressure control hole 132 and the second pressure control hole 134 may be positioned on one vertical line. The vertical line passing through the first pressure control hole 132 and the second pressure control hole 134 may correspond to the concentric axis of the inlet port 112 and the outlet port 114. The first pressure control hole 132 may align with the second pressure control hole 134 when viewed from the vertical line L1.

The first pressure control hole 132 may have a quadrangular shape. In example embodiments, the first pressure control hole 132 may have a rectangular shape substantially the same as that of the first fixed hole 122. Thus, the first pressure control hole 132 may have short edges 133a and 133b having an arc shape and substantially perpendicular to the axial direction of the rotating cylinder 130 (when viewed from the vertical line L1), and long edges 133c and 133d parallel to the axial direction of the rotating cylinder 130.

When the rotating cylinder 130 is rotated with respect to the axial direction, the first pressure control hole 132 is also rotated. Thus, an opening ratio of the first fixed hole 122 exposed through the first pressure control hole 132 may be changed in accordance with rotation angles of the rotating cylinder 130. The gas inflow rate into the rotating cylinder 130 may be controlled by changing the opening ratio of the first fixed hole 122.

As mentioned above, the first fixed hole 122 and the first pressure control hole 132 may have substantially the same rectangular shape. The rotating unit 140 may rotate the rotating cylinder 130 by a uniform angle. As can be seen in FIG. 1, in some embodiments, the rotating unit 140 includes a coupling unit 144, also described as a shaft, and described in more detail below, connected to an end surface 136 of the rotating cylinder 130.

As can be seen in FIG. 5, in some embodiments, in order to allow for smooth aligning and fluid flow when the first fixed hole 122 and first pressure control hole 132 are fully opened allowing for the first fixed hole 122 to have maximum flow, long edges 123c and 123d and long edges 133c and 133d may have angled surfaces, so that they align smoothly when connected and fully opened. In other embodiments, the long edges may be cut in a manner so that their surfaces align vertically with respect to each other when the first fixed hole 122 is fully open and the first pressure control hole 132 are fully opened. In other embodiments, the size of the first pressure control hole 132 is bigger, at least in terms of the lengths of the short edges 133a and 133b than the size of the first fixed hole 122 (e.g., lengths of the short edges 123a and 123b), so that the first fixed hole 122 can be fully open without any portion of the long edges 133c or 133d of the first pressure control hole 132 getting in the way.

Figure 6:
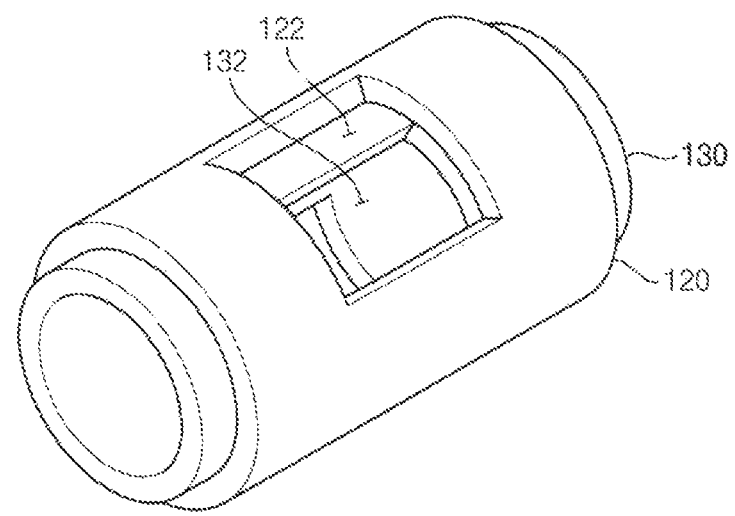

FIG. 6 is a perspective view illustrating the rotating cylinder in FIG. 5 primarily rotated from a fully opened position.

Referring to FIG. 6, when the rotating cylinder 130 is primarily rotated by the rotating unit 140, the first pressure control hole 132 may also be rotated at an angle the same as a rotated angle of the rotating cylinder 130. A first portion of the first fixed hole 122 closed by the outer surface of the rotating cylinder 130 may have a first long rectangular shape. Thus, the first portion of the first fixed hole 122 may have a first closed area corresponding to an area of the first long rectangular shape.

Figure 7:
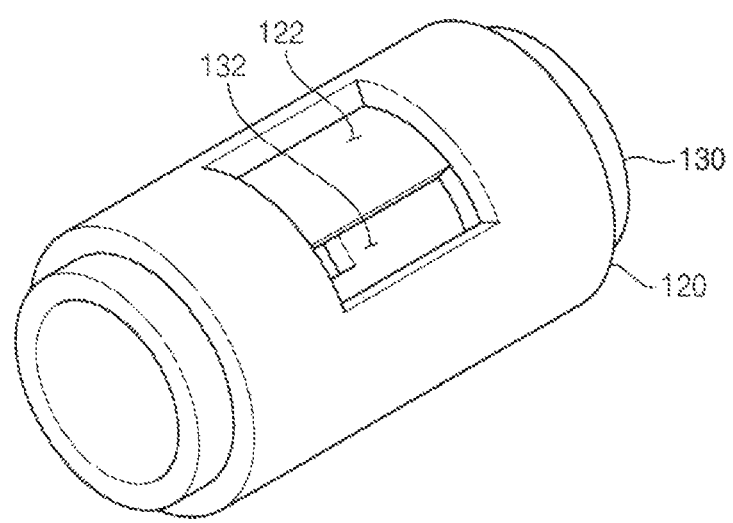

FIG. 7 is a perspective view illustrating the rotating cylinder in FIG. 6 secondarily rotated.

Referring to FIG. 7, when the rotating cylinder 130 may be secondarily rotated by the rotating unit 140, a second portion of the first fixed hole 122 closed by the outer surface of the rotating cylinder 130 may have a second long rectangular shape. The second long rectangular shape may have a long side length substantially the same as that of the first long rectangular shape, and a short side length of two times a short side length of the first long rectangular shape. Thus, the second long rectangular shape has an area of two times the area of the first long rectangular shape.

Therefore, the opening ratio of the first fixed hole 122 exposed through the first pressure control hole 132 may be uniformly, and linearly changed in accordance with the uniform rotation of the rotating cylinder 130. As a result, the opening ratio of the first fixed hole 122 may be more accurately and easily controlled so that the gas inflow rate into the rotating cylinder 130 through the first fixed hole 122 and the first pressure control hole 132 are also accurately controlled.

The second pressure control hole 134 may have a quadrangular shape. In example embodiments, the second pressure control hole 134 may have a rectangular shape substantially the same as that of the second fixed hole 132. Further, the rectangular shape of the second pressure control hole 134 may be substantially the same as the rectangular shape of the first pressure control hole 132. Thus, the second pressure control hole 134 may have short edges substantially perpendicular to the axial direction of the rotating cylinder 130 (when viewed from the line L1), and long edges parallel to the axial direction of the rotating cylinder 130. Edge sizes and hole sizes of the second pressure control hole 134 and second fixed hole 132 may have the same relationship to each other as described above in connection with FIG. 5 (e.g., with respect to edge angles of the long edges and with respect to short edge lengths).

When the rotating cylinder 130 is rotated with respect to the axial direction, the second pressure control hole 134 is also rotated. Thus, an opening ratio of the second fixed hole 124 exposed through the second pressure control hole 134 may be changed in accordance with rotation angles of the rotating cylinder 130. The gas outflow rate into the rotating cylinder 130 may be controlled by changing the opening ratio of the second fixed hole 124.

As shown in FIG. 6, when the rotating cylinder 130 is primarily rotated by the rotating unit 140, the second pressure control hole 134 also rotated at an angle the same as a rotated angle of the rotating cylinder 130. A first portion of the second fixed hole 124 closed by the outer surface of the rotating cylinder 130 may have a first long rectangular shape. Thus, the first portion of the second fixed hole 124 may have a first closed area corresponding to an area of the first long rectangular shape.

As shown in FIG. 7, when the rotating cylinder 130 is secondarily rotated by the rotating unit 140, a second portion of the second fixed hole 124 closed by the outer surface of the rotating cylinder 130 has a second long rectangular shape. The second long rectangular shape may have a long edge length the same as that of the first long rectangular shape, and a short edge length of two times a short edge length of the first long rectangular shape. Thus, the second long rectangular shape has an area of two times the area of the first long rectangular shape.

Therefore, the opening ratio of the second fixed hole 124 exposed through the second pressure control hole 134 may be uniformly and linearly changed in accordance with the uniform rotation of the rotating cylinder 130. As a result, the opening ratio of the second fixed hole 124 may be accurately controlled so that the gas outflow rate into the rotating cylinder 130 through the second fixed hole 124 and the second pressure control hole 134 is also accurately controlled.

The rotating unit 140 may be configured to rotate the rotating cylinder 130 by the uniform angle. The rotating unit 140 may include a stepping motor 142, a coupling 144 (e.g., shaft) and a controller 146. The coupling 144 may be connected between the stepping motor 142 and the rotating cylinder 130, and may connect to an end surface 136 of the rotating cylinder 130. Thus, a rotary force generated from the stepping motor 142 may be transmitted to the rotating cylinder 130 through the coupling 144. The controller 146 may control the stepping motor 142.

The detecting unit 150 may be configured to detect the rotating angles of the rotating cylinder 130. The detecting unit 150 may include a rotating key 152 and a sensor 154. The rotating key 152 may be attached to the rotating cylinder 130. Thus, the rotating key 152 may be rotated together with the rotating cylinder 130. The sensor 154 may detect the rotating key 152 to detect the rotation angles of the rotating cylinder 130. Alternatively, the rotating key 152 may be attached to the coupling 144. Based on the information from the sensor 154, the detecting unit 150 can determine a rotation angle of the rotating cylinder 130. Based on information from the detecting unit 150, the controller 146 can control how much and in what direction to rotate the coupling 144 in order to rotate the rotating cylinder 130 with respect to the fixed cylinder 120. The controller 140, as well as the detecting unit 150, may include hardware and/or software configured to control the coupling 144 to achieve a desired rotation, for example based on an input received from an input/output device in addition to the determined and detected rotation angle.

Figure 8:
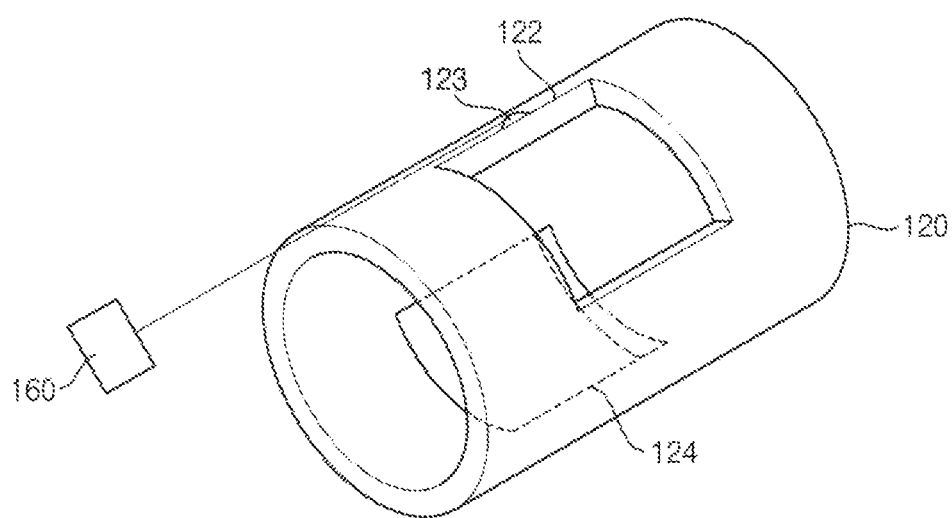
Figure 9:
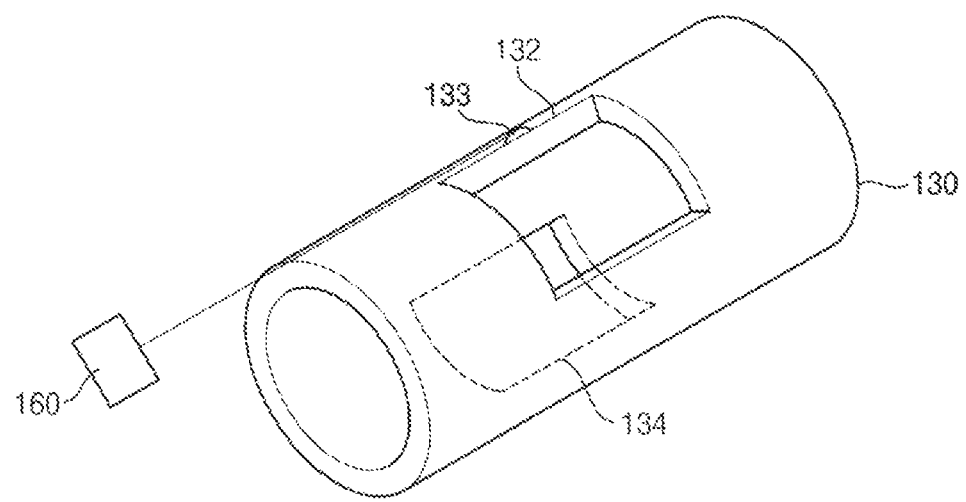

FIG. 8 is an exploded perspective view illustrating a fixed cylinder and a rotating cylinder in accordance with example embodiments, and FIG. 9 is a perspective view illustrating the fixed cylinder and the rotating cylinder in FIG. 8.

A pressure control valve 100a of this example embodiment may include elements substantially the same as those of the pressure control valve 100 in FIG. 4 except for further including a fixing groove and an aligning groove. Thus, the same reference numerals may refer to the same elements and any further illustrations with respect to the same elements may be omitted herein for brevity.

Referring to FIGS. 8 and 9, a fixing groove 123 may be formed at the first fixed hole 122. The fixing groove 123 may be formed at any one of the long edges of the first fixed hole 122. Alternatively, the fixing groove 123 may be formed at both long edges of the first fixed hole 122. Further, the fixing groove 123 may be formed at the second fixed hole 124. Furthermore, the fixing groove 123 may be formed at the first and second fixed holes 122 and 124.

An aligning groove 133 may be formed at the first pressure control hole 132. The aligning groove 133 may be formed at any one of the long edges of the first pressure control hole 132. Alternatively, the aligning groove 133 may be formed at both long edges of the first pressure control hole 132. Further, the aligning groove 133 may be formed at the second pressure control hole 134. Furthermore, the aligning groove 133 may be formed at the first and second pressure control holes 132 and 134.

The aligning groove 133 may be rotated together with the first pressure control hole 132. Thus, the opening ratio of the first fixed hole 122 may be at a maximum (e.g., about 100% at a position where the aligning groove 133 is accurately aligned with the fixing groove 123. Similarly, the opening ratio of the second fixed hole 124 may be at a maximum (e.g., about 100%) at a position where the aligning groove 133 is accurately aligned with the fixing groove 123.

A sensor 160 may be configured to detect the fixing groove 123 and the aligning groove 133. An aligned position between the fixing groove 123 and the aligning groove 133 detected by the sensor 160 may be set as an initial position of the rotating cylinder 130.

Apparatus for Processing a Substrate

Figure 10:
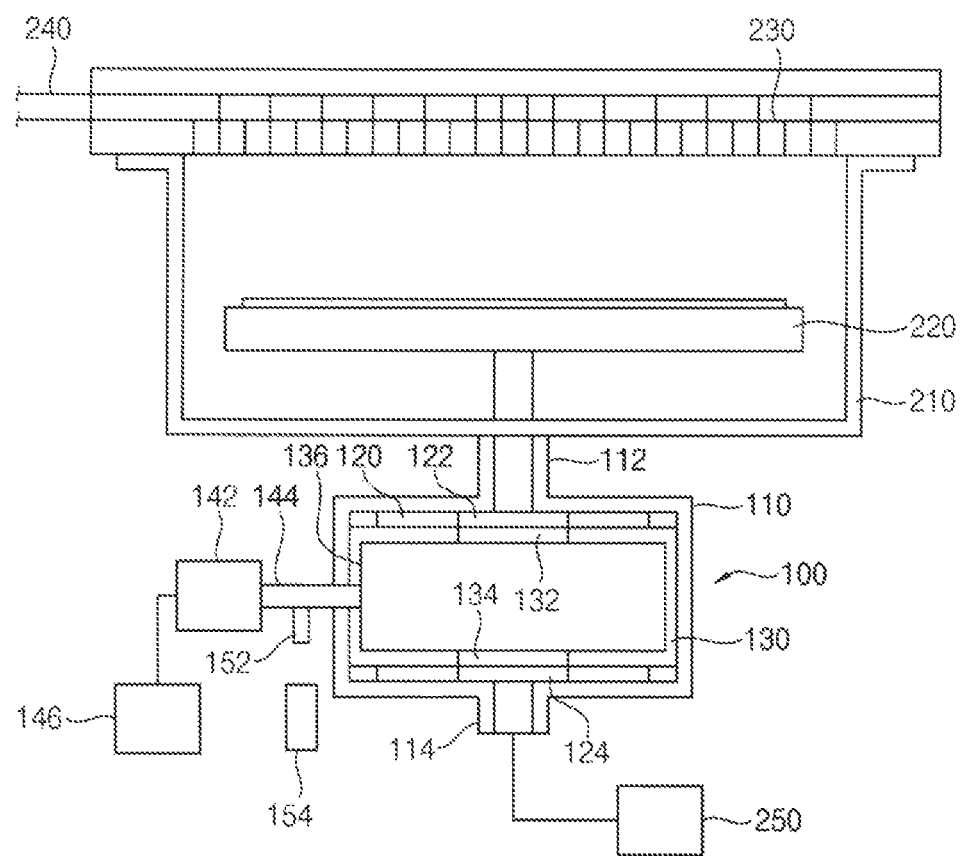

FIG. 10 is a cross-sectional view illustrating an apparatus for processing a substrate and including the pressure control valve in FIG. 1.

Referring to FIG. 10, an apparatus 200 for processing a substrate in accordance with example embodiment may include a chamber 210, a susceptor 220, a showerhead 230, a gas line 240, a pressure control valve 100 and a vacuum pump 250.

The chamber 210 may be configured to receive a substrate. In example embodiments, the substrate may include a semiconductor substrate. The chamber 210 may be a chemical vapor deposition (CVD) chamber. Particularly, the chamber 210 may be a metal organic CVD (MOCVD) chamber. Alternatively, the chamber 210 may be a physical vapor deposition (PVD) chamber, or an atomic layer deposition (ALD) chamber.

The susceptor 220, also described as a platform, may be arranged on a bottom surface of the chamber 210. The substrate may be placed on an upper surface of the susceptor 220. The susceptor 220 may be configured to heat the substrate.

The showerhead 230 may be arranged over the susceptor 220 in the chamber 210. The showerhead 230 may be configured to inject a process gas to the substrate on the susceptor 220.

The gas line 240 may be connected to a sidewall of the chamber 210. The process gas may be introduced into the chamber 210 through the gas line 240. A purge gas may also be introduced into the chamber 210 through the gas line 240.

The vacuum pump 250 may be connected to the bottom surface of the chamber 210. The vacuum pump 250 may apply vacuum to the chamber 210 to exhaust the gases from the chamber 210.

The pressure control valve 100 may be arranged between the chamber 210 and the vacuum pump 250. The pressure control valve 100 of this example embodiment may include elements substantially the same as those of the pressure control valve 100 in FIG. 4. Thus, the same reference numerals may refer to the same elements and any further illustrations with respect to the same elements may be omitted herein for brevity.

The inlet port 112 of the pressure control valve 100 may be connected to the bottom surface of the chamber 210. The outlet port 114 of the pressure control valve 100 may be connected to the vacuum pump 250.

According to example embodiments, the fixed hole and the pressure control hole may have the quadrangular shape so that the fixed hole and the pressure control hole may have a relatively large size. Thus, the pressure control valve including the quadrangular fixed hole and the quadrangular pressure control hole may have improved pressure control function. Further, an opening ratio between the quadrangular fixed hole and the quadrangular pressure control hole may be uniformly changed by rotating the rotating cylinder. Therefore, the opening ratio between the quadrangular fixed hole and the quadrangular pressure control hole may be accurately controlled so that the internal pressure of the chamber may also be accurately controlled.

In this manner, the opening ratio between a quadrangular fixed hole of a first cylinder and a quadrangular pressure control hole of a second cylinder arranged coaxially, inside, and in contact with the first cylinder, is controlled by a controller, in order to control the internal pressure of the chamber. Based on one or more selected inner pressures, one or more processes can be performed on the semiconductor substrate to form one or more layers on the substrate.

Figure 11:
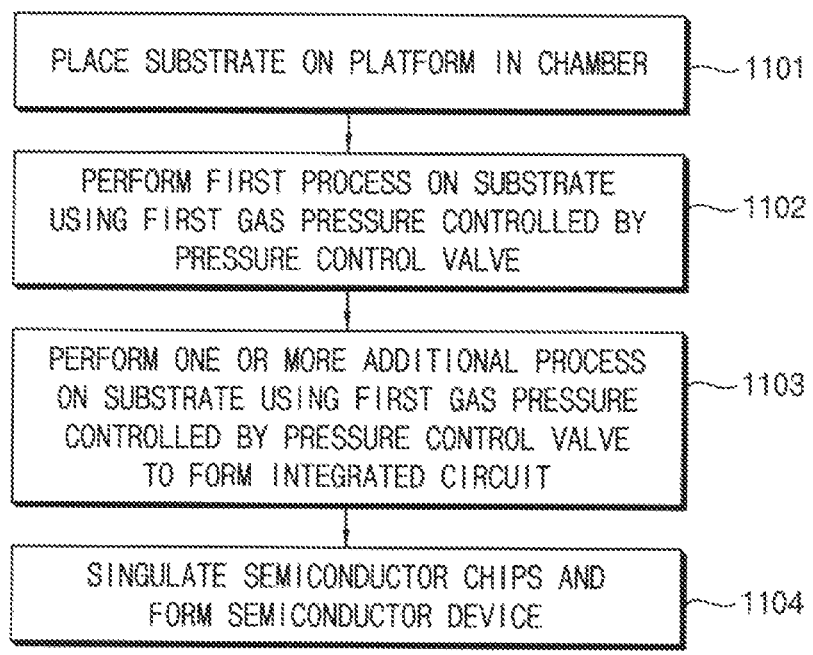

FIG. 11 is a flow chart illustrating a method for processing a substrate and manufacturing a semiconductor device in accordance with example embodiments, and is described below in connection with FIG. 10. In step 1101, a substrate, such as a semiconductor substrate, is placed on a platform, such as susceptor 220, in a chamber 210. In step 1102, a first process is performed on the substrate, such as a CVD process, ALD process, etc. During the first process, a pressure of gas being input to the chamber 210 is controlled by a pressure control valve 100. For example, the pressure may be controlled by controlling a rotation of a rotatable cylinder 130 placed inside a fixed cylinder 120, wherein both cylinders include quadrangular-shaped holes. Therefore, the amount of rotation of the quadrangular-shaped holes with respect to each other controls the amount of gas passing through the pressure control valve 100, which in turn controls the pressure of the gas inside the chamber 210.

In step 1103, one or more processes are performed on the wafer, for example to form different layers on the substrate and to form an integrated circuit on the substrate. Some or all of these steps may actually occur prior to step 1102, in some embodiments. The integrated circuits formed can form different semiconductor chips on the substrate separated by scribe regions. The different layers formed in these one or more processes can be formed by controlling the gas pressure in the chamber 210 by rotating the rotatable cylinder 130 with respect to the fixed cylinder 120. For example, in forming the first layer, the rotatable cylinder 130 can be rotated a first amount so first and second pressure control holes 132 and 134 of the rotatable cylinder 130 cover a first amount of first and second fixed holes 122 and 124 of the fixed cylinder 120, so that first and second fixed holes 122 and 124 of the fixed cylinder 120 are a certain percentage open (e.g., a first percentage such as 50% by non-limited example). In forming a second layer, the rotatable cylinder 130 can be rotated a second amount so first and second pressure control holes 132 and 134 of the rotatable cylinder 130 cover a second amount of first and second fixed holes 122 and 124 of the fixed cylinder 120, so that first and second fixed holes 122 and 124 of the fixed cylinder 120 are a certain percentage open (e.g., a second percentage such as 30% by non-limited example). The processes can continue, with different gas pressures inside the chamber 210 controlled by different opening ratios of the first and second fixed holes 122 and 124.

After these processes are complete, integrated circuits are formed on the semiconductor wafer to form semiconductor chips. The semiconductor chips can then be singulated (step 1104) into individual semiconductor chips, which each form a semiconductor device, and which may be used to form other semiconductor devices, such as a semiconductor package having a package substrate, one or more semiconductor chips, and an encapsulation layer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pressure control valve comprising:
   a valve body including an inlet port and an outlet port;
   a fixed cylinder fixed to an inner wall of the valve body, the fixed cylinder including a quadrangular first fixed hole connected to the inlet port and a quadrangular second fixed hole connected to the outlet port; and
   a rotating cylinder rotatably arranged in the fixed cylinder, the rotating cylinder including a quadrangular first pressure control hole selectively connected to the first fixed hole and a quadrangular second pressure control hole selectively connected to the second fixed hole,
   wherein the fixed cylinder further comprises a fixing groove formed on at least one of the first fixed hole and the second fixed hole, the rotating cylinder further comprises an aligning groove formed on at least one of the first pressure control hole and the second pressure control hole, and the aligning groove is configured to be selectively aligned with the fixing groove.

2. The pressure control valve of claim 1, wherein the second fixed hole has a size the same as that of the second pressure control hole.

3. The pressure control valve of claim 2, wherein the second fixed hole and the second pressure control hole have a rectangular shape.

4. The pressure control valve of claim 3, wherein the second fixed hole has a long edge parallel to an axial direction of the fixed cylinder, and the second pressure control hole has a long edge parallel to an axial direction of the rotating cylinder.

5. The pressure control valve of claim 4, wherein the second fixed hole has a length of the long edge of no less than 30% of an axial length of the fixed cylinder, and the second pressure control hole has a length of the long edge of no less than 30% of an axial length of the rotating cylinder.

6. The pressure control valve of claim 3, wherein the size of the second fixed hole and the second pressure control hole is the same as that of the first fixed hole and the first pressure control hole.

7. The pressure control valve of claim 1, further comprising a sensor configured to detect the fixing groove and the aligning groove.

8. The pressure control valve of claim 1, wherein the inlet port and the outlet port of the valve body are positioned on a straight line.

9. The pressure control valve of claim 8, wherein the fixed cylinder and the rotating cylinder have an axial direction perpendicular to the straight line.

10. The pressure control valve of claim 9, wherein the first fixed hole and the second fixed hole are positioned on the straight line.

11. The pressure control valve of claim 1, wherein the rotating cylinder has an outer surface configured to rotatably contact an inner surface of the fixed cylinder.

12. The pressure control valve of claim 1, further comprising a rotating unit configured to rotate the rotating cylinder.

13. The pressure control valve of claim 12, wherein the rotating unit comprises:
a coupling connected to the rotating cylinder; and
a stepping motor configured to rotate the coupling.

14. The pressure control valve of claim 13, wherein the rotating unit further comprises a controller configured to control the stepping motor.

15. The pressure control valve of claim 1, further comprising a detecting unit configured to detect an initial position of the rotating cylinder.

16. The pressure control valve of claim 15, wherein the detecting unit comprises:
a rotating key rotated together with the rotating cylinder; and
a sensor configured to detect the rotating key.

17. The pressure control valve of claim 1, wherein the first fixed hole and the first pressure control hole have a rectangular shape.

18. The pressure control valve of claim 17, wherein the first fixed hole has a long edge parallel to an axial direction of the fixed cylinder, and the first pressure control hole has a long edge parallel to an axial direction of the rotating cylinder.

19. A pressure control valve comprising:
a valve body including an inlet port and an outlet port;
a fixed cylinder fixed to an inner wall of the valve body, the fixed cylinder including a quadrangular first fixed hole connected to the inlet port and a quadrangular second fixed hole connected to the outlet port; and
a rotating cylinder rotatably arranged in the fixed cylinder, the rotating cylinder including a quadrangular first pressure control hole selectively connected to the first fixed hole and a quadrangular second pressure control hole selectively connected to the second fixed hole,
wherein the first fixed hole and the first pressure control hole have a rectangular shape,
wherein the first fixed hole has a long edge parallel to an axial direction of the fixed cylinder, and the first pressure control hole has a long edge parallel to an axial direction of the rotating cylinder, and
wherein the first fixed hole has a length of the long edge of no less than 30% of an axial length of the fixed cylinder, and the first pressure control hole has a length of the long edge of no less than 30% of an axial length of the rotating cylinder.

20. A pressure control valve comprising:
a valve body including an inlet port and an outlet port, the inlet port and the outlet port positioned on a straight line;
a fixed cylinder fixed to an inner wall of the valve body, the fixed cylinder including a rectangular first fixed hole connected to the inlet port and a rectangular second fixed hole connected to the outlet port, and the fixed cylinder having an axial direction perpendicular to the straight line;
a rotating cylinder rotatably arranged in the fixed cylinder, the rotating cylinder including a rectangular first pressure control hole selectively connected to the first fixed hole and a rectangular second pressure control hole selectively connected to the second fixed hole, the first pressure control hole having four sides sized to align with four respective sides of the first fixed hole, the second pressure control hole having four sides sized to align with four respective sides of the second fixed hole, and the rotating cylinder having an axial direction parallel to the axial direction of the fixed cylinder; and
a rotating unit configured to rotate the rotating cylinder.

21. The pressure control valve of claim 20, wherein the rectangular first fixed hole has a long edge parallel to the axial direction of the fixed cylinder, and the rectangular first pressure control hole has a long edge parallel to the axial direction of the rotating cylinder.

22. The pressure control valve of claim 21, wherein the rectangular first fixed hole has a length of the long edge of no less than 30% of an axial length of the fixed cylinder, and the rectangular first pressure control hole has a length of the long edge of no less than 30% of an axial length of the rotating cylinder.

23. The pressure control valve of claim 20, wherein the rectangular second fixed hole has a long edge parallel to the axial direction of the fixed cylinder, and the rectangular second pressure control hole has a long edge parallel to the axial direction of the rotating cylinder.

24. The pressure control valve of claim 23, wherein the rectangular second fixed hole has a length of the long edge of no less than 30% of an axial length of the fixed cylinder, and the rectangular second pressure control hole has a length of the long edge of no less than 30% of an axial length of the rotating cylinder.

25. The pressure control valve of claim 20, wherein the size of the second fixed hole and the second pressure control hole is the same as that of the first fixed hole and the first pressure control hole.

26. The pressure control valve of claim 20, wherein the fixed cylinder further comprises a fixing groove formed on at least one of the first fixed hole and the second fixed hole, the rotating cylinder further comprises an aligning groove formed on at least one of the first pressure control hole and the second pressure control hole, and the aligning groove is configured to be selectively aligned with the fixing groove.

27. The pressure control valve of claim 26, further comprising a sensor configured to detect the fixing groove and the aligning groove.

28. The pressure control valve of claim 20, wherein the rotating cylinder has an outer surface configured to rotatably contact an inner surface of the fixed cylinder.

29. The pressure control valve of claim 20, wherein the rotating unit comprises:
a coupling connected to the rotating cylinder;
a stepping motor configured to rotate the coupling; and
a controller configured to control the stepping motor.

30. The pressure control valve of claim 20, further comprising a detecting unit configured to detect an initial position of the rotating cylinder.

31. The pressure control valve of claim 30, wherein the detecting unit comprises:
a rotating key rotated together with the rotating cylinder; and
a sensor configured to detect the rotating key.

* * * * *